United States Patent
Lakdawala et al.

(10) Patent No.: US 7,812,750 B2
(45) Date of Patent: Oct. 12, 2010

(54) SIGMA-DELTA CONVERTER NOISE CANCELLATION

(75) Inventors: Hasnain Lakdawala, Beaverton, OR (US); Soumyanath Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 12/239,294

(22) Filed: Sep. 26, 2008

(65) Prior Publication Data

US 2010/0079324 A1    Apr. 1, 2010

(51) Int. Cl.
  *H03M 3/00*  (2006.01)
(52) U.S. Cl. .................. 341/143; 341/155; 341/120
(58) Field of Classification Search .......... 341/143, 341/155
  See application file for complete search history.

(56) References Cited

U.S. PATENT DOCUMENTS

| | | | | |
|---|---|---|---|---|
| 6,218,972 | B1 * | 4/2001 | Groshong | 341/143 |
| 6,489,913 | B1 * | 12/2002 | Hansen et al. | 341/156 |
| 6,525,682 | B2 * | 2/2003 | Yap et al. | 341/137 |
| 2004/0252038 | A1 | 12/2004 | Robinson et al. | |
| 2007/0001754 | A1 | 1/2007 | Lakdawala et al. | |

FOREIGN PATENT DOCUMENTS

JP  05-152967 A  6/1993
KR  10-2004-0037216 A  5/2004

OTHER PUBLICATIONS

Li et al., "A Cascaded Sigma-Delta Pipeline ADC Structure Design," National Key Labs of Analog ICs, Sichuan Institute of Solid-State Circuits, 2006, IEEE, CETC Chongqing 400060, P.R. China.
Brooks et al., "A Cascaded Sigma-Delta Pipeline A/D Converter with 1.25 MHz Signal Bandwidth and 89 dB SNR," Journal of Solid-State Circuits, Dec. 1997, pp. 1896-1906, vol. 32—No. 12, IEEE.
Pamarti et al., "A Wideband 2.4-GHz Delta-Sigma Fractional-N PLL With 1-Mb/s In-Loop Modulation," Jan. 1, 2004, pp. 49-61, vol. 39, IEEE Journal of Solid-State Circuits.

* cited by examiner

*Primary Examiner*—Jean B Jeanglaude
(74) *Attorney, Agent, or Firm*—Schwabe, Williamson & Wyatt, P.C.

(57) ABSTRACT

Embodiments provide apparatuses, systems, and methods to convert an analog signal input into a sigma-delta digital output at a high sampling rate and correct for noise components of the digital output. An analog filter coupled to a sigma-delta converter accepts a noise-shaped analog signal from the sigma-delta converter to attenuate signal components of the noise-shaped analog signal at a plurality of folding frequencies associated with a sampling rate of a low-speed Analog-To-Digital (ADC) to produce a filtered output. The low-speed ADC is coupled to an output of the analog filter and samples the filtered output of the analog filter at a sampling rate slower than the high sample rate to output an ADC digital output. Other embodiments may be described and claimed.

20 Claims, 4 Drawing Sheets

Power/freq (dB/rad/sample)

Figure 1:
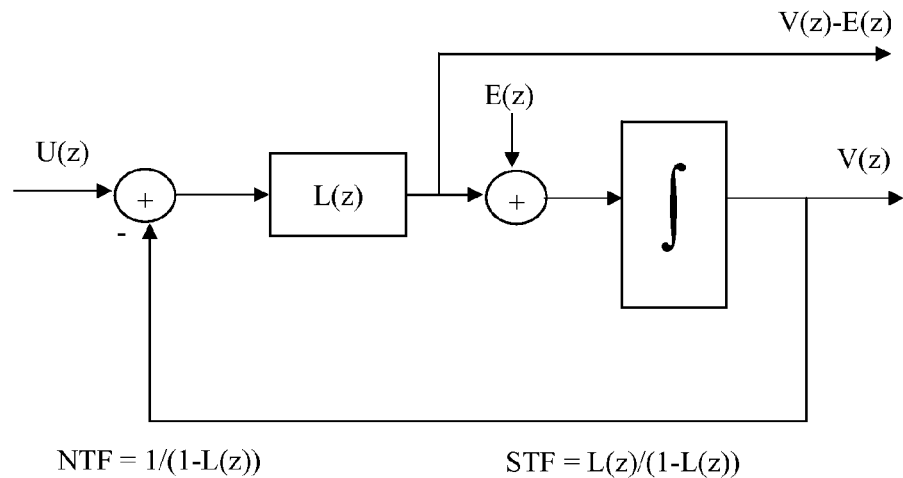

SIGMA-DELTA CONVERTER NOISE CANCELLATION

TECHNICAL FIELD

Embodiments relate to the field of analog-to-digital converters and, in particular, to noise cancellation within a sigma-delta converter.

BACKGROUND

Sigma-Delta analog-to-digital converters (ADC) use noise-shaping to move quantization noise to higher frequencies that are out of the band of interest. Then, the signal is passed through a low-pass filter to eliminate those higher frequencies. In order to increase the sample rate, a higher-order sigma-delta converter must be used to properly noise-shape the signal and move quantization noise out of the band of interest. These higher-order sigma-delta converters consume more power, are more complex, and take up more die space than lower-order sigma-delta converters.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

FIG. 1 illustrates a block diagram of a sigma-delta converter in accordance with embodiments;

FIG. 2 illustrates a block diagram of a noise cancellation circuit with analog subtraction in accordance with various embodiments;

FIG. 3*a* illustrates an infinite impulse response (IIR) and finite impulse response (FIR) decimation filter in accordance with various embodiments;

FIG. 3*b* illustrates a timing diagram for the operation of the IIR and FIR decimation filter shown in FIG. 3*a* according to embodiments;

FIG. 4 illustrates a filter response of a an infinite impulse response and finite impulse response decimation filter in accordance with various embodiments;

FIG. 5 represents the power spectral density of a sigma-delta converter in accordance with various embodiments;

FIG. 6 illustrates the power spectral density of a noise signal filtered by embodiments; and FIG. 7 illustrates a block diagram of a noise cancellation circuit with digital subtraction in accordance with various embodiments.

DETAILED DESCRIPTION OF EMBODIMENTS

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order-dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

The description may use perspective-based descriptions such as up/down, back/front, and top/bottom. Such descriptions are merely used to facilitate the discussion and are not intended to restrict the application of embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments, are synonymous.

In embodiments, an analog decimation filter may be used to accept an analog signal resulting from the loop transfer function of a low-order sigma-delta. The analog decimation filter may be configured to attenuate signal components of the noise-shaped signal at the folding frequencies of a low-speed analog-to-digital converter (ADC). In other words, signal components at or near multiples of the Nyquist frequency above the sampling rate of the low-speed ADC may be attenuated, e.g., reduced or eliminated. Thus, when the signal is then passed into the low-speed ADC, there may be little folding of the higher frequency components into the band of interest caused by biasing at or near multiples of the Nyquist frequency. The digitized signal may then be combined with a digitized output of the sigma-delta to digitally cancel noise components of the digitized output of the sigma-delta converter. Achieving proper noise-shaping with a high-order sigma-delta converter would likely involve higher power consumption and increased circuit complexity. The low-speed ADC may allow lower power consumption; the analog-decimation filter may allow the low-speed ADC to operate at low speed without folding noise components back into the band of interest. The description that follows uses exemplary embodiments to elaborate in more detail, but embodiments are not limited to these exemplary embodiments.

FIG. 1 illustrates a block diagram of a sigma-delta converter according to embodiments. An input analog signal U(z) may be input into the sigma-delta converter. A loop transfer function L(z) may be applied to the input signal, the signal may then integrated, and digital output signal V(z) produced. Quantization error or noise E(z) is shown in FIG. 1 as being applied prior to the integration process. E(z) may not be purposefully added, but instead may be a by-product of the quantization process. Thus, E(z) is shown added for illustrative purposes only. A feedback mechanism may noise-shape the signal. A signal transfer function (STF) may be given by STF=L(z)/(1−L(z)) and a noise transfer function may be given by NTF=1/(1−L(z)). The sigma-delta modulator shown in FIG. 1 may be configured to produce a noise-shaped analog signal denoted by V(z)−E(z). The output response of the sigma-delta converter shown in FIG. 1 may be given by V(z)=STF(z)·U(z)+NTF(z)·E(z).

As noted above, attenuating the quantization noise could be accomplished by designing the sigma-delta converter to have a noise-transfer function to push the quantization noise out of the band of interest (e.g. using a high-order sigma-delta). On the other hand, if the noise-shaping properties of the sigma-delta converter are such that not all quantization noise is moved out of the band of interest, then some other error correction may be desired. If the quantization noise signal E(z) from FIG. 1 could be measured or estimated with high accuracy, then it could be cancelled from the sigma-delta digital output. One challenge associated with known methods of estimating E(z) is that they require a converter that operates at the same speed as the sigma-delta converter itself. Embodiments may conserve power by reducing the sampling rate of a converter used to estimate E(z).

Figure 2:
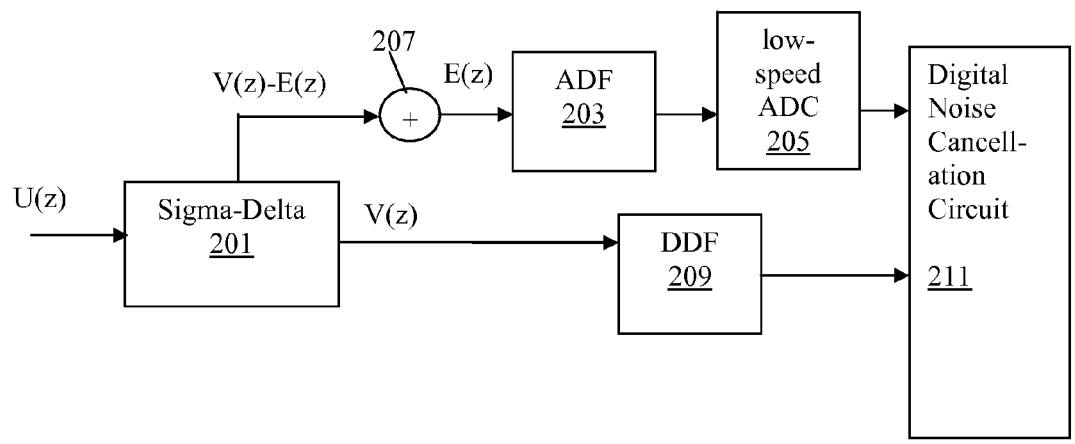

FIG. 2 illustrates a block diagram of a noise cancellation circuit with analog subtraction in accordance with various embodiments. Sigma-delta converter 201 has two outputs similar to the sigma-delta converter shown in FIG. 1. Output V(z) is a digital output signal sampled at a quantization rate having some error component (e.g. noise or error) E(z). Also, an analog noise-shaped signal is output and is shown denoted by V(z)−E(z). Not shown in FIG. 2 may be a digital-to-analog converter (DAC) to convert the V(z) signal to an analog signal for subtraction by analog subtractor 207. The output of subtractor 207 may be an analog error signal representing or approximating the quantization noise E(z). A filter, such as analog decimation filter (ADF) 203, may be configured to filter this analog error signal. In embodiments, it may be configured to attenuate signal components of the analog error signal at a plurality of folding frequencies associated with a sampling rate of low-speed ADC 205. Low-speed ADC 205 may be configured to convert this filtered analog error signal to produce a digital representation of the quantization error E(z). In embodiments, the sampling rate of low-speed ADC 205 may be lower than the sample rate of sigma-delta converter 201. After being filtering by analog decimation filter 203, the error signal may have little or no signal components at multiples of the folding frequencies of low-speed ADC 205. Without the analog decimation filter, low-speed ADC 205 (which may act in part as a low-pass filter) may sample the filtered analog error signal and produce biasing caused by signal components at or near multiples of the sampling frequency of low-speed ADC 205 being folded back into the band of interest. Thus, the digital representation of the error signal might, in that case, have biasing components. Attenuating signal components at or near multiples of the sampling frequency, on the other hand, facilitates the elimination or significant reduction of such bias signals. Embodiments may attenuate the analog signal only at or substantially near multiples of the sampling frequency. Any low-pass filter may work, so long as it is configured to attenuate signal components at or near multiples of the sampling frequency. It may not be required, in embodiments, for such a filter to attenuate only signal components at those frequencies.

Digital decimation filter (DDF) 209 may be used to downconvert the digital output of the sigma-delta converter V(z). Then, digital noise cancellation circuit 211 may be configured to cancel out the quantization noise component of V(z) using the digitized output of the low-speed ADC which represents an approximation of the quantization error and the downconverted digital signal.

Low-speed ADC 205 may be a flash converter, a pipe ADC, a Successive Approximation Register (SAR), a second sigma-delta converter having a lower signal-to-noise ratio than the quantizer inside the sigma-delta converter, or other ADC.

Figure 3A:
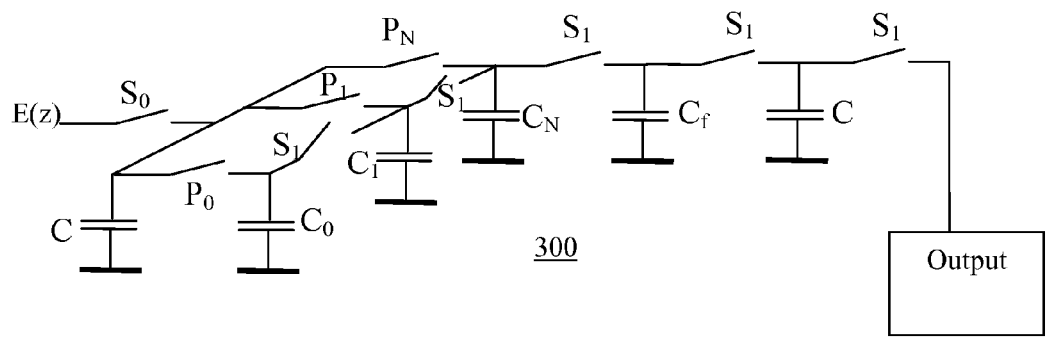
Figure 3B:
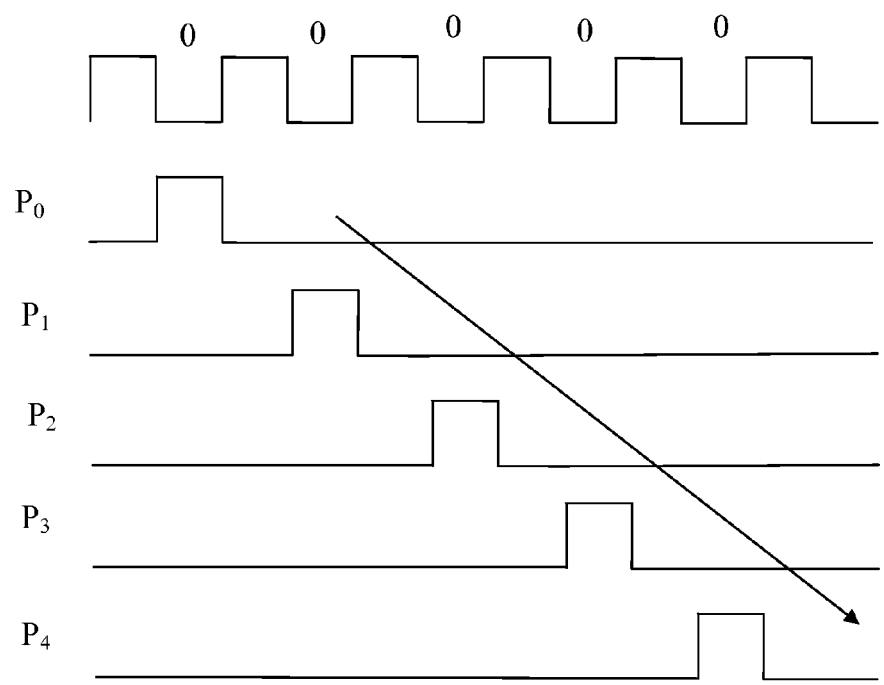

FIG. 3a illustrates an infinite impulse response (IIR) and finite impulse response (FIR) decimation filter in accordance with various embodiments. In embodiments, analog decimation filter 203 may be filter 300 shown in FIG. 3. In other embodiments, analog decimation filter 203 may have some other configuration. An analog input E(z)—such as for example the analog error signal discussed in relation to FIG. 2—may be input into filter 300. Filter 300 may include a switch $S_0$ which may be closed and opened every clock cycle. Each of switches $P_0$ through $P_{N-1}$ may be coupled to a common node coupled to switch $S_0$. Each may also be coupled to one of capacitors $C_0$ through $C_{N-1}$. Each of switches $P_0$ through $P_{N-1}$ may be closed every Nth clock cycle, but not on the same clock cycles. This is shown in FIG. 3b. For example, switch $P_0$ may be closed beginning on the falling edge of clock cycle 0 to begin the process, and opened again on the subsequent rising edge. Switch $P_1$ may then be closed on subsequent clock cycle 1. Switch $P_2$ may then be closed on subsequent clock cycle 2 and so on until switch $P_{N-1}$ may be closed on clock cycle N−1. Each of switches $P_1$ through $P_N$ may be coupled to capacitors $C_0$ through $C_{N-1}$. As this proceeds, analog decimation filter may be configured to sample and store the analog signal E(z) on capacitors $C_0$ through $C_{N-1}$ on successive clock pulses. On the Nth clock cycle, each of switches $S_1$ may be configured to close to sum the successive clock pulses stored on capacitors $C_0$ through $C_{N-1}$ onto output capacitor $C_f$. The process of charge sharing on capacitor $C_f$ may produce an IIR response in addition to a FIR response. The approximate discrete time filter form implemented by this scheme may be described by:

$$T_f(z) = \frac{(1-\alpha)\sum_{k=0}^{N}\alpha_k z^{-k}}{(1-\alpha z^{-1})}$$

where:

$$\delta_1 = \frac{C_q}{C_s + C_q}$$

and $$\delta_2 = \frac{NC_q}{N*C_q + C_f},$$

and $$\alpha = \frac{(1-\delta_2)}{(1-\delta_2)+\delta_2(1-\delta_1)}$$

Where $T_f(z)$ may be the transfer function of the filter, $\alpha$ may be the IIR filter coefficient that determines the roll off frequency, $\alpha_k$ may be the coefficients of the FIR filter, $C_q$ may be the value of the unit N capacitors, $C_0$ through $C_{N-1}$, and $C_f$ may be the value of the terminal charge sharing capacitor.

In embodiments, a correction charge capacitor (not shown) may be added to filter 300 thereby providing a correction charge equal to the product of the capacitance of the correction charge capacitor and a supply voltage.

Figure 4:
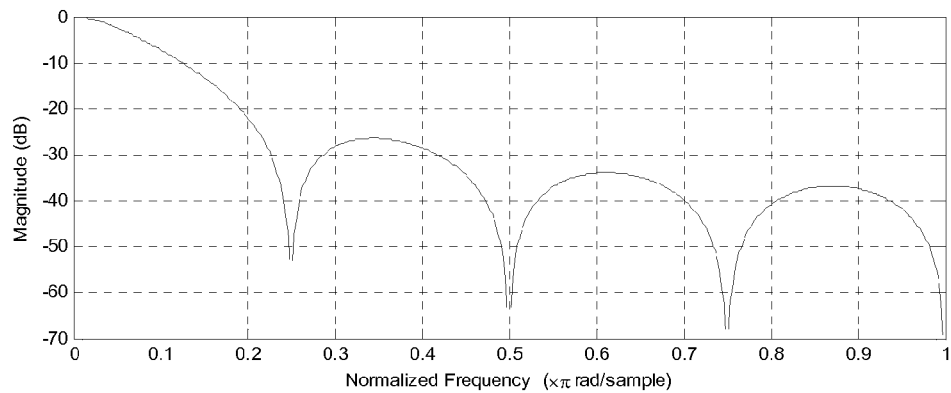

FIG. 4 illustrates a filter response of an infinite impulse response and finite impulse response decimation filter—such as for example filter 300 in FIG. 3—in accordance with various embodiments. With the proper choice of coefficients in the combined IIR and FIR filter such as is shown in FIG. 3, the frequency response may result as shown in FIG. 4. The periodic dips in the power spectral density shown in FIG. 4 may—if the coefficients are chosen properly—coincide at multiples of the folding frequencies of a low-speed ADC as described elsewhere within this description. In this way, once the filtered signal is passed into the low-speed ADC, the low-speed ADC may digitize the signal without producing unwanted biasing errors caused by signal components within the analog error signal that occur at those folding frequencies. The same thing could be accomplished by use of a standard low-pass filter. But, such a standard low-pass filter may in most situations be more complex and power-consuming than, for example, analog decimation filter 300. Embodiments, on the other hand, may provide a low-power, small component solution that attenuates not all signal elements outside the band of interest, but only those at or near the folding frequencies of the low-speed ADC.

Figure 5:
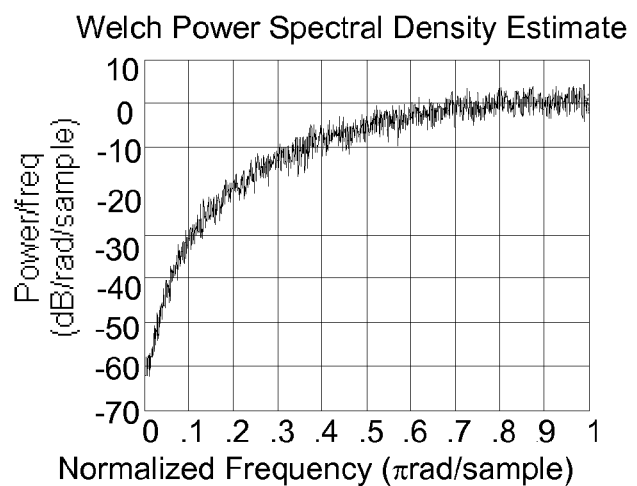
Figure 6:
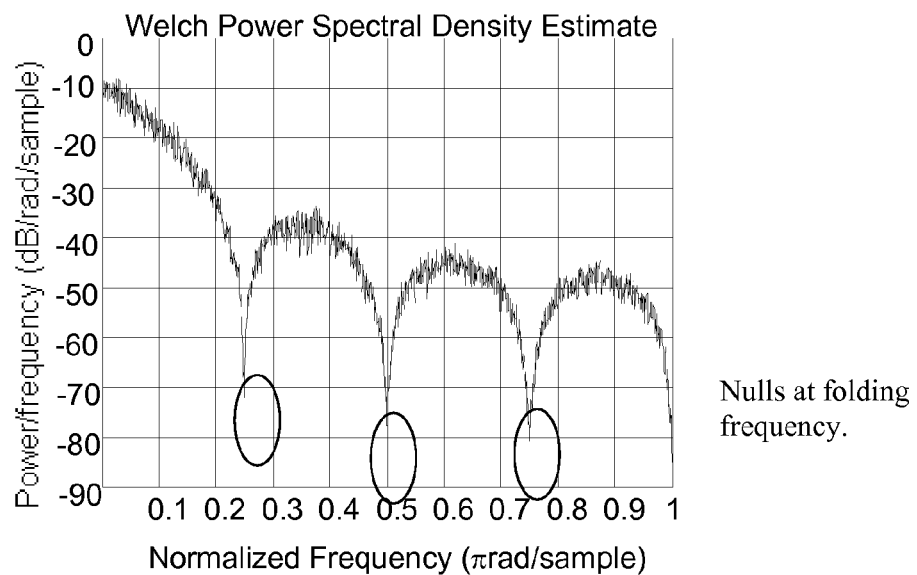

FIG. 5 represents the power spectral density of a sigma-delta converter output signal in accordance with various embodiments. FIG. 6 illustrates the power spectral density of the sigma-delta converter output signal filtered by an analog decimation filter such as, for example, filter 300 of FIG. 3. The dips in the signal (circled) may occur at multiples of the folding frequency of a low-speed ADC as described elsewhere within this specification if coefficients are chosen properly for the analog decimation filter. The low-speed ADC may then be used to digitize the signal without producing biasing caused by signal elements at multiples of the folding frequency.

Figure 7:
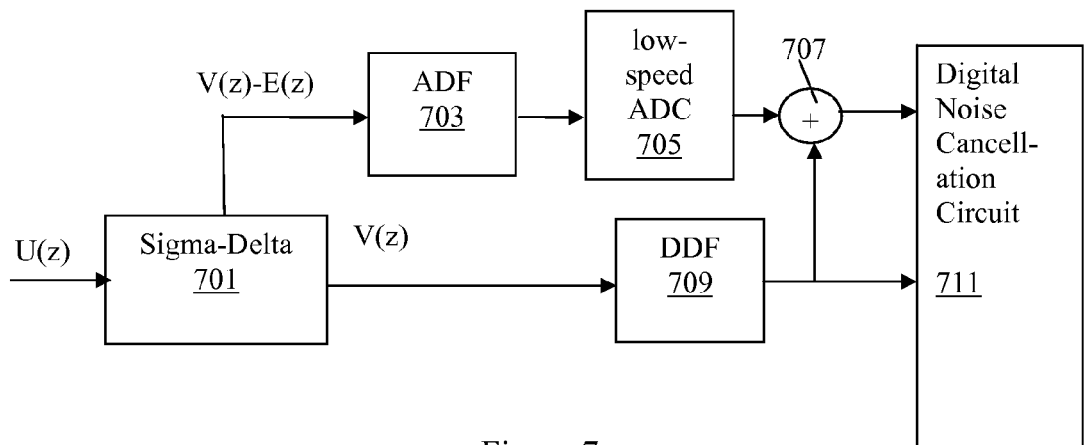

FIG. 7 illustrates a block diagram of a noise cancellation circuit with digital subtraction in accordance with various embodiments. Sigma-delta converter 701, ADF 703, low-speed ADC 705, digital noise cancellation circuit 711, and DDF 709 may be the same or similar to corresponding components shown in FIG. 2 and described elsewhere within this specification. However, there is no analog subtractor (as shown in FIG. 2). Instead, digital subtractor 707 may be situated between low-speed ADC 705 and digital noise cancellation circuit 711. Thus, the circuit shown in FIG. 7 may not subtract an analog version of the digital output of the sigma-delta modulator from the noise-shaped analog signal from sigma-delta converter as described in relation to FIG. 2. Rather, analog decimation filter 703 may be configured to accept the noise-shaped analog signal directly, and low-speed ADC 705 may be configured to convert the signal to a digital representation. Then subtractor 707 may be configured to subtract the output of digital decimation filter 709 from the resulting filtered signal to produce a digitized approximation of the quantization error to be used by digital noise cancellation circuit 711 to correct for the quantization errors in sigma-delta digital output V(z).

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the disclosure. Those with skill in the art will readily appreciate that embodiments of the disclosure may be implemented in a very wide variety of ways. This application is intended to cover any adaptations or variations of the embodiments discussed herein. Therefore, it is manifestly intended that embodiments of the disclosure be limited only by the claims and the equivalents thereof.

The invention claimed is:

1. An apparatus comprising:
a sigma-delta converter to convert an analog input signal into a sigma-delta digital output at a sampling rate, the sigma-delta digital output having quantization errors;
an analog filter coupled to the sigma-delta converter to accept a noise-shaped analog signal from the sigma-delta converter, different from the sigma-delta digital output, and to attenuate signal components of the noise-shaped analog signal at a plurality of folding frequencies associated with another sampling rate, which is lower than the sampling rate, to produce a filtered output; and
an analog-to-digital converter (ADC) directly coupled to an output of the analog filter to sample the filtered output of the analog filter at the another sampling rate to output an ADC digital output.

2. The apparatus of claim 1 wherein the analog filter is configured to attenuate signal components of the noise-shaped analog signal only at or substantially near the plurality of the folding frequencies of the ADC.

3. The apparatus of claim 1 wherein the analog filter is an analog decimation filter.

4. The apparatus of claim 3 further comprising:
a digital decimation filter coupled to the sigma-delta converter to down-sample the sigma-delta digital output to produce a down-sampled output; and
a digital subtractor to subtract the down-sampled output from the ADC digital output to produce a digital error signal approximating the quantization errors in the sigma-delta digital output.

5. The apparatus of claim 4 further comprising a digital correction circuit coupled to the subtractor and to the digital decimation filter to digitally correct the down-sampled output using the digital error signal.

6. The apparatus of claim 3 wherein the analog decimation filter comprises N bank capacitors each coupled to an input of the analog decimation filter via one of N bank switches, the analog decimation filter further comprising an output capacitor and at least one output switch coupling the N bank capacitors to the output capacitor, each bank switch being configured to open once every N clock cycles to charge its corresponding bank capacitor and the at least one output switch being configured to open once during each N clock cycles to cause the charges on each bank capacitor to be summed onto the output capacitor.

7. The apparatus of claim 3 comprising an analog subtractor situated between the sigma-delta modulator and the analog decimation filter, and wherein the noise-shaped analog signal is an analog error signal approximating the quantization errors in the sigma-delta digital output, the analog error signal resulting from a subtraction, by the analog subtractor, of an analog version of the sigma-delta digital output and an unquantized noise-shaped signal from the sigma-delta converter.

8. The apparatus of claim 7 further comprising a digital decimation filter coupled to the sigma-delta converter to down-sample the sigma-delta digital output to produce a down-sampled output.

9. The integrated circuit of claim 8 further comprising a digital correction circuit coupled to the ADC and to the digital decimation filter to digitally correct the down-sampled output using the ADC digital output.

10. The apparatus of claim 1 wherein the ADC is a flash converter, a pipe ADC, a Successive Approximation Register (SAR), or a second sigma-delta converter having a lower signal-to-noise ratio than a quantizer inside the sigma-delta converter.

11. A method comprising:

accepting an analog input signal;

noise-shaping the analog input signal to produce a noise-shaped analog signal;

digitizing the analog input signal at a sampling rate to produce a sigma-delta digital output signal having a noise-shaped noise component;

filtering at least components of the noise-shaped analog signal to attenuate signal components of the noise-shaped analog signal at a plurality of folding frequencies associated with another sampling rate lower than the sampling rate to produce a filter signal; and digitizing the filtered signal at the other sampling rate to produce a digitized filtered signal.

12. The method of claim 11 wherein the filtering of the noise-shaped analog signal attenuates the noise-shaped analog signal only substantially near the plurality of the folding frequencies.

13. The method of claim 11 further comprising subtracting an analog version of the sigma-delta digital output and the noise-shaped analog signal to produce an error signal approximating the noise-shaped noise component of the sigma-delta digital output, and the filtering comprises filtering the error signal.

14. The method of claim 11 further comprising correcting the sigma-delta digital output signal using the digitized filtered signal.

15. The method of claim 14 wherein the correcting comprises subtracting a down-sampled version of the sigma-delta output signal from the digitized filtered signal and performing digital error correction on the sigma-delta digital output signal.

16. A system comprising:

an antenna to forward a modulated signal; and a modulating circuit coupled to the antenna and including:

a sigma-delta converter to convert an analog signal input into a sigma-delta digital output at a sampling rate, the sigma-delta digital output having quantization errors;

an analog filter coupled to the sigma-delta converter to accept a noise-shaped analog signal from the sigma-delta converter, different from the digital output, and to attenuate signal components of the noise-shaped analog signal at a plurality of folding frequencies associated with another sampling rate, which is lower than the sampling rate, to produce a filtered output;

an analog-to-digital converter (ADC) directly coupled to an output of the analog filter to sample the filtered output of the analog filter at the another sampling rate to output an ADC digital output; and an error-correction circuit to error-correct the sigma-delta digital output for transmission of the sigma-delta digital output by the antenna.

17. The system of claim 16 wherein the analog filter is configured to attenuate signal components of the noise-shaped analog signal only at or substantially near the plurality of the folding frequencies of the ADC.

18. The system of claim 16 wherein the analog filter is an analog decimation filter.

19. The system of claim 18 further comprising a digital decimation filter coupled to the sigma-delta converter to down-sample the sigma-delta digital output to produce a down-sampled output and a digital subtractor to subtract the down-sampled output from the ADC digital output to produce a digital error signal approximating the quantization errors in the sigma-delta digital output.

20. The system of claim 18 comprising an analog subtractor situated between the sigma-delta modulator and the analog decimation filter, and wherein the noise-shaped analog signal is an analog error signal approximating the quantization errors in the sigma-delta digital output, the analog error signal resulting from a subtraction, by the analog subtractor, of an analog version of the sigma-delta digital output and an unquantized noise-shaped signal from the sigma-delta converter.

* * * * *